(12) United States Patent
Hill et al.

(10) Patent No.: US 10,128,364 B2
(45) Date of Patent: Nov. 13, 2018

(54) SEMICONDUCTOR DEVICES WITH AN ENHANCED RESISTIVITY REGION AND METHODS OF FABRICATION THEREFOR

(71) Applicant: Freescale Semiconductor, Inc., Austin, TX (US)

(72) Inventors: Darrell Hill, Chandler, AZ (US); Bruce Green, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/083,084

(22) Filed: Mar. 28, 2016

(65) Prior Publication Data

US 2017/0278961 A1    Sep. 28, 2017

(51) Int. Cl.

| | |
|---|---|
| *H01L 29/778* | (2006.01) |
| *H01L 21/02* | (2006.01) |
| *H01L 21/265* | (2006.01) |
| *H01L 29/10* | (2006.01) |
| *H01L 29/20* | (2006.01) |
| *H01L 29/205* | (2006.01) |
| *H01L 29/207* | (2006.01) |
| *H01L 29/66* | (2006.01) |
| *H01L 29/32* | (2006.01) |

(52) U.S. Cl.
CPC ...... *H01L 29/7787* (2013.01); *H01L 21/0254* (2013.01); *H01L 21/02458* (2013.01); *H01L 21/26546* (2013.01); *H01L 29/1025* (2013.01); *H01L 29/2003* (2013.01); *H01L 29/205* (2013.01); *H01L 29/207* (2013.01); *H01L 29/32* (2013.01); *H01L 29/66462* (2013.01); *H01L 29/7786* (2013.01)

(58) Field of Classification Search
CPC ............ H01L 29/66462; H01L 29/432; H01L 29/66431; H01L 29/7783
See application file for complete search history.

(56) References Cited

U.S. PATENT DOCUMENTS

| | | |
|---|---|---|
| 5,891,798 A | 4/1999 | Doyle et al. |
| 7,538,010 B2 | 5/2009 | Faure et al. |
| 7,772,602 B2 | 8/2010 | Lee et al. |

(Continued)

FOREIGN PATENT DOCUMENTS

| | | |
|---|---|---|
| JP | 2009-302191 A | 12/2009 |
| JP | 2013-179337 A | 9/2013 |
| WO | 2015/155932 A1 | 10/2015 |

*Primary Examiner* — Julia Slutsker (74) *Attorney, Agent, or Firm* — Bruce M. Green; Sherry W. Schumm (57) ABSTRACT

Embodiments of a semiconductor device include a base substrate including an upper surface, a nucleation layer disposed over the upper surface of the base substrate, a first semiconductor layer disposed over the nucleation layer, a second semiconductor layer disposed over the first semiconductor layer, a channel within the second semiconductor layer and proximate to an upper surface of the second semiconductor layer, and an enhanced resistivity region with an upper boundary proximate to an upper surface of the first semiconductor layer. The enhanced resistivity region has an upper boundary located a distance below the channel. Embodiments of a method of fabricating the semiconductor device include implanting one or more ion species through the first semiconductor layer to form the enhanced resistivity region.

24 Claims, 4 Drawing Sheets

(56) References Cited

U.S. PATENT DOCUMENTS

| | | |
|---|---|---|
| 8,183,124 B2 | 5/2012 | Mazzola |
| 8,823,057 B2 | 9/2014 | Sheppard et al. |
| 2003/0020092 A1* | 1/2003 | Parikh .................. H01L 29/518 |
| | | 257/192 |
| 2007/0235775 A1* | 10/2007 | Wu ....................... H01L 29/404 |
| | | 257/288 |
| 2008/0124851 A1* | 5/2008 | Zhang ................. H01L 29/7787 |
| | | 438/172 |
| 2009/0189190 A1* | 7/2009 | Hashimoto ....... H01L 21/02389 |
| | | 257/194 |
| 2010/0117118 A1* | 5/2010 | Dabiran ............... H01L 29/207 |
| | | 257/190 |
| 2014/0253241 A1 | 9/2014 | Lee et al. |
| 2017/0069746 A1* | 3/2017 | Roberts .................. H01L 29/32 |
| 2017/0133217 A1 | 5/2017 | Sato et al. |

* cited by examiner

SEMICONDUCTOR DEVICES WITH AN ENHANCED RESISTIVITY REGION AND METHODS OF FABRICATION THEREFOR

TECHNICAL FIELD

Embodiments of the subject matter described herein relate generally to type III-N semiconductor devices, and more specifically to GaN transistor devices.

BACKGROUND

A typical gallium nitride (GaN) device (e.g., a GaN transistor) is fabricated by depositing a nucleation layer over a base substrate, and subsequently depositing a buffer layer over the nucleation layer, where the nucleation layer functions to initiate epitaxial growth of the buffer layer. After deposition of the nucleation and buffer layers, additional GaN material, other semiconductor layers, and other structures (e.g., gate, drain, and source contacts) are formed over the buffer layer to complete the device.

A memory effect referred to as "drain lag" is a significant issue in GaN semiconductor devices. Drain lag is a trapping phenomenon that originates in inherent material characteristics such as lattice mismatches at the origin of dislocations. More specifically, drain lag is at least partially caused by traps in the epitaxial material between the channel and the base substrate, where the epitaxial material includes the nucleation and buffer layers. Ideally, the nucleation and buffer layers would be electrically inactive. In practice, however, these layers may contribute significant and undesirable leakage current and output conductance, thus decreasing the performance of the GaN device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of semiconductor devices and fabrication methods described herein address the issue of the undesirable tradeoff between leakage current and drain lag in a type III-N device (e.g., a gallium nitride (GaN) device) by including an enhanced resistivity region below the device channel within at least a portion of the buffer layer, the nucleation layer, and the substrate. More specifically, during fabrication of a semiconductor device (e.g., a GaN transistor), an ion implantation process is performed to implant ions into and through at least a portion of the buffer layer, and also through the underlying nucleation layer, in an embodiment. In the semiconductor device, this process may make the buffer and/or nucleation layers more highly resistive (or electrically inert), which may result in a reduction in leakage current through the buffer and/or nucleation layers.

In some devices, in order to reduce leakage current, iron (Fe) or carbon (C) are incorporated as active dopants (e.g., as substitutional impurities) in the device in the vicinity of the nucleation layer to reduce or prevent leakage through the buffer of the device. Unfortunately, however, the presence of Fe or C as a substitutional impurity dopant may cause significantly higher drain lag. Accordingly, the use of Fe or C in this manner may present an undesirable tradeoff between drain lag and leakage current. By including an enhanced resistivity region in the semiconductor material below the device channel by intentionally disrupting the lattice and/or introducing compensating dopants using ion implantation, embodiments of semiconductor devices described herein may have significantly lower leakage current than conventional devices without a significant increase in drain lag.

Figure 1:
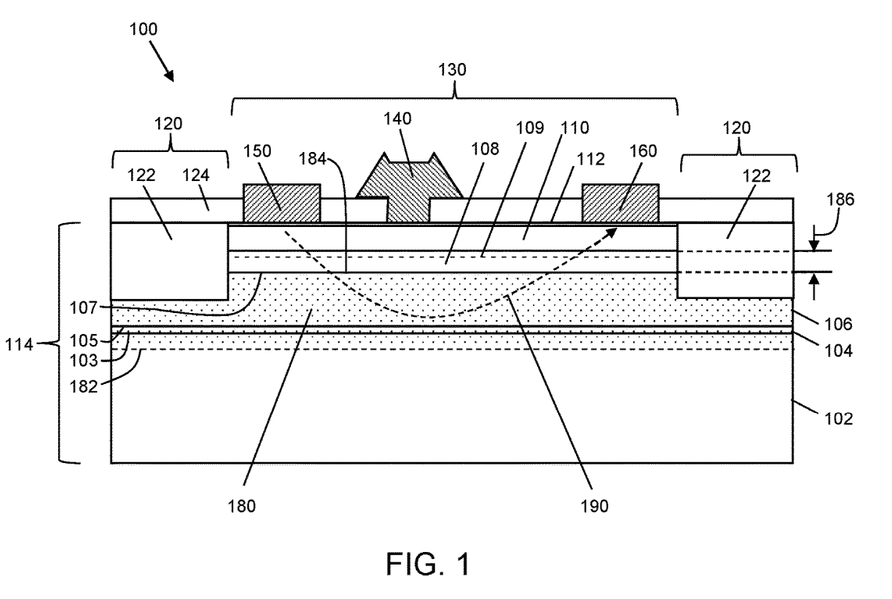
FIG. 1 is a cross-sectional, side view of a semiconductor device with an enhanced resistivity region, in accordance with an example embodiment.

FIG. 1 is a cross-sectional, side view of a semiconductor device 100 with an enhanced resistivity region below the device channel 109, in accordance with an example embodiment. The semiconductor device 100 includes a semiconductor substrate 114, isolation regions 120, and an active region 130 within which a high electron mobility transistor (HEMT) is formed. The transistor includes a gate electrode 140 and first and second current carrying contacts 150, 160 (e.g., source and drain contacts) formed over the substrate 114, and a channel 109 formed within the substrate 114. The isolation regions 120 separate the active region 130 (and the transistor) from other adjacent devices (not shown) that also may be formed in and over the semiconductor substrate 114.

The semiconductor substrate 114 may include a base substrate 102, a nucleation layer 104, a buffer layer 106 (or "first semiconductor layer"), a channel layer 108 (or "second semiconductor layer"), a barrier layer 110, and a cap layer 112. In an embodiment, the base substrate 102 includes a silicon carbide (SiC) substrate. In other embodiments, the base substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials.

The nucleation layer 104 is formed on or over the upper surface 103 of the base substrate 102. An embodiment of the nucleation layer 104 includes a heteroepitaxial layer formed from a material selected from AlN, GaN, aluminum gallium nitride (AlGaN), indium aluminum nitride (InAlN), indium gallium nitride (InGaN), or other suitable materials. The nucleation layer 104 starts at the upper surface 103 of the base substrate 102 and has a thickness in a range of about 100 angstroms to about 2000 angstroms.

The buffer layer 106 is formed on or over the upper surface 105 of the nucleation layer 104. According to an embodiment, the buffer layer 106 may include one or more group III-N semiconductor layers. Each of the one or more semiconductor layers of the buffer layer 106 may include an epitaxially grown group III-nitride epitaxial layer. The group-III nitride epitaxially layers that make up the buffer layer 106 may be nitrogen (N)-face or gallium (Ga)-face material, for example. In still other embodiments, the semiconductor layers of the buffer layer 106 may include Si, GaAs, InP, or other suitable materials.

In an embodiment, the buffer layer 106 is grown epitaxially on the nucleation layer 104. The buffer layer 106 may include at least one AlGaN mixed crystal layer. The total thickness of the buffer layer 106 with all of its layers may be between about 200 angstroms and about 5,000 angstroms, although other thicknesses may be used. As will be described in more detail later, and in an embodiment, the thickness of the buffer layer 106 does not exceed a thickness through which an ion species may be implanted to form an implanted region 180 (indicated with shading in FIG. 1), which extends through the buffer layer 106 and the nucleation layer 104, and into the base substrate 102. At least a portion of the implanted region 180 comprises an "enhanced resistivity region" in which the resistivity of the buffer layer 106 may be increased by intentionally disrupting the lattice and/or introducing compensating dopants through the ion implantation process used to form the implanted region 180. In various embodiments, the enhanced resistivity region may correspond to the portion of the implanted region 180 that is present within the buffer layer 106, the portion of the implanted region 180 that is present within the buffer and nucleation layers 106, 104, or the portion of the implanted region 180 that is present within the buffer and nucleation layers 106, 104 and the base substrate 102.

Each of the at least one AlGaN mixed crystal layers of the buffer layer 106 may have a composition denoted by $Al_XGa_{1-X}N$ with an aluminum mole fraction, X, that can take on values between 0 and 1. A limiting X value of 0 yields pure GaN while a value of 1 yields pure aluminum nitride (AlN). In an embodiment, the $Al_XGa_{1-X}N$ layer(s) may be configured as GaN (X=0) where the $Al_XGa_{1-X}N$ is not intentionally doped (NID). The $Al_XGa_{1-X}N$ layer(s) may also be configured as one or more GaN layers where the one or more GaN layers are intentionally doped with dopants that may include Si, germanium (Ge), iron (Fe), chromium (Cr), carbon (C), magnesium (Mg) or other suitable dopants that render the buffer layer 106 substantially insulating or high resistivity. The dopant concentration may be between about $10^{17}$ cm$^{-3}$ and about $10^{19}$ cm$^{-3}$ although other higher or lower concentrations may be used. In an alternate embodiment, the $Al_XGa_{1-X}N$ layer(s) may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments, the $Al_XGa_{1-X}N$ layers may be configured as a superlattice where the additional layers include a series of alternating NID or doped $Al_XGa_{1-X}N$ layers where the value of X takes a value between 0 and 1. In still other embodiments, the buffer layer 106 may also or alternatively include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms although other thicknesses may be used.

In an embodiment, and as mentioned above, one or more ion species are implanted into and through the buffer layer 106 and the nucleation layer 104, and into the substrate 102 to form an implanted region 180, all or a portion of which corresponds to an enhanced resistivity region. As used herein, the term "enhanced resistivity" means having an electrical resistivity that is significantly higher than the resistivity of the buffer layer 106 without implantation of the ion species, where "significantly higher" means at least two times higher, in an embodiment, at least 10 times higher, in another embodiment, at least 100 times higher, in yet another embodiment. In still other embodiments, "significantly higher" means at least 1000 times higher. For example, the resistivity of the enhanced resistivity region may be within a range of about $10^5$ ohm-cm to about $10^{10}$ ohm-cm, although the resistivity of the enhanced resistivity region may be lower or higher, as well.

In an embodiment, the implanted region 180 has an upper boundary 184 that substantially coincides with the upper surface 107 of the buffer layer 106, although the upper boundary may be above or below the upper surface 107 of the buffer layer 106, as well.

In addition, the implanted region 180 has a lower boundary 182 that is located a distance below the upper surface 103 of the base substrate 102, in an embodiment. For example, the lower boundary 182 of the implanted region 180 may be in a range of about 50 angstroms to about 20,000 angstroms below the upper surface 103 of the base substrate 102, although the lower boundary 182 may be located at a shallower or deeper distance below the upper surface 103 of the base substrate 102, as well. In still other embodiments, the lower boundary 182 may substantially coincide with the upper surface 103 of the base substrate 102, or the lower boundary 182 may be above the upper surface 103 of the base substrate 102 (e.g., the lower boundary 182 may be in the nucleation layer 104 or the buffer layer 106).

In various embodiments, the one or more ion species within the implanted region 180 include one or more ion species that may significantly disrupt the crystal lattice and/or introduce compensating dopants during the implantation process, resulting in a significant increase in the resistivity of the crystal lattice in the enhanced resistivity portion of the implanted region 180. According to various embodiments, the one or more ion species are selected from boron, arsenic, helium, beryllium, magnesium, argon, aluminum, phosphorus, nitrogen, oxygen, carbon, and iron. Other suitable ion species may be used, as well (e.g., other species that sufficiently disrupt the crystal lattice and/or introduce compensating dopants to provide significantly higher resistivity in the enhanced resistivity portion of implanted region 180). Further, the dopant concentration of the one or more ion species within the enhanced resistivity region may be between about $10^{15}$ cm$^{-3}$ and about $10^{19}$ cm$^{-3}$ in some embodiments and may be between about $5\times10^{15}$ cm$^{-3}$ and about $1\times10^{18}$ cm$^{-3}$ in other embodiments, though other higher or lower concentrations may be used. Methods for forming the implanted region 180 will be discussed in more detail below.

In an embodiment, a channel layer 108 is formed on or over the upper surface 107 of the buffer layer 106 and the implanted region 180. The channel layer 108 may include one or more group III-N semiconductor layers. The channel layer 108 may include an $Al_XGa_{1-X}N$ layer where X takes on values between 0 and 1. In an embodiment, the channel layer 108 is configured as GaN (X=0) although other values of X may be used. The thickness of the channel layer 108 may be between about 100 angstroms and about 10.0 microns, or between about 1000 angstroms to about 5000 angstroms, or between about 1000 angstroms to about 1.0 microns, although other thicknesses alternatively may be used. The channel layer 108 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used. In other embodiments, the channel layer may include NID or doped $In_YGa_{1-Y}N$, where Y, the indium mole fraction, may take a value between 0 and 1.

A barrier layer 110 is formed on or over the channel layer 108 in accordance with an embodiment. The barrier layer 110 may include one or more group III-N semiconductor layers. In some embodiments, the barrier layer 110 has a larger bandgap and larger spontaneous polarization than the channel layer 108 and, when the barrier layer 110 is in direct contact with the channel layer 108, a channel 109 is created in the form of a two dimensional electron gas (2-DEG) within the channel layer 108 near the interface between the channel layer 108 and barrier layer 110. In addition, strain between the barrier layer 110 and channel layer 108 may cause additional piezoelectric charge to be introduced into the 2-DEG and channel. The barrier layer 110 may include at least one NID $Al_xGa_{1-x}N$ layer where X takes on values between 0 and 1. In some embodiments, X may take a value of 0.1 to 0.35, although other values of X may be used. The thickness of the barrier layer 110 may be between about 50 angstroms and about 1000 angstroms although other thicknesses may be used. The barrier layer 110 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$, although other higher or lower concentrations may be used. In addition, there may be an additional AlN interbarrier layer (not shown) formed between the channel layer 108 and the barrier layer 110, in some embodiments. The AlN interbarrier layer may increase the channel charge and improve the electron confinement of the resultant 2-DEG. In other embodiments, the barrier layer 110 may include indium aluminum nitride (InAlN) layers, denoted $In_YAl_{1-Y}N$, where Y, the indium mole fraction, may take a value between about 0.1 and about 0.2 although other values of Y may be used. In the case of an InAlN barrier, the thickness of the barrier layer 110 may be between about 50 angstroms and about 2000 angstroms, although other thicknesses may be used. In the case of using InAlN to form the barrier layer 110, the InAlN may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used.

According to an embodiment, the upper boundary 184 of the implanted region 180 is located a distance 186 below the channel 109 and the upper surface of the channel layer 108. In other words, a region of semiconductor material between the upper boundary 184 of the implanted region 180 and the channel 109 does not include a significant concentration of the ion species introduced into the substrate 114 to be classified as an enhanced resistivity region.

In an embodiment illustrated in FIG. 1, a cap layer 112 may be formed on or over the barrier layer 110. The cap layer 112 presents a stable surface for the semiconductor substrate 114 and serves to protect the surface of the semiconductor substrate 114 from chemical and environmental exposure incidental to wafer processing. The cap layer 112 may include one or more group III-N semiconductor layers. In an embodiment, the cap layer 112 is GaN. The thickness of the cap layer 112 may be between about 5 angstroms and about 100 angstroms, although other thicknesses may be used. The cap layer 112 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used.

Without departing from the scope of the inventive subject matter, it should be appreciated that the choice of materials and arrangement of layers to form semiconductor substrate 114 is exemplary. The inclusion of the base substrate 102, a nucleation layer 104, a buffer layer 106, a channel layer 108, a barrier layer 110, and a cap layer 112 into the semiconductor substrate 114 is exemplary and that the function and operation of the various layers may be combined and may change depending on the materials used in any specific embodiment. In other embodiments using N-polar materials (not shown), the channel layer 108 may be disposed over the barrier layer 110 to create a 2-DEG and channel directly underneath an optional cap 112 and gate electrode 140. Still further embodiments may include semiconductor layers formed from materials including GaAs, aluminum gallium arsenide (AlGaAs), indium gallium arsenide (InGaAs), and aluminum indium arsenide (AlInAs) to form the semiconductor substrate 114.

One or more isolation regions 120 may be formed in the semiconductor substrate 114 to define an active region 130 along upper surface of the semiconductor substrate 114, according to an embodiment. The isolation regions 120 may be formed via an implantation procedure configured to damage the epitaxial and/or other semiconductor layers to create high resistivity regions 122 of the semiconductor substrate 114, rendering the semiconductor substrate 114 high resistivity or semi-insulating in those high resistivity regions 122 while leaving the crystal structure intact in the active region 130. For example, isolation regions 120 may be formed by implanting an ion species at an energy sufficient to drive the species through cap layer 112, barrier layer 110, channel layer 108, and buffer layer 106 thus damaging the crystal lattice for these layers, disrupting channel 109 within the isolation regions 120, and creating high resistivity regions 122 within semiconductor substrate 114. In other embodiments, the isolation regions 120 may be formed by removing one or more of the epitaxial and/or other semiconductor layers of the semiconductor substrate 114, rendering the remaining layers of the semiconductor substrate 114 semi-insulating and leaving behind active region 130 "mesas" surrounded by high resistivity or semi-insulating isolation regions 120.

In an embodiment, a first dielectric layer 124 may be formed over the active region 130 and isolation regions 120. For example, the first dielectric layer 124 may include one of $Si_3N_4$, silicon dioxide ($SiO_2$), silicon oxynitride (SiON), $Al_2O_3$, hafnium dioxide ($HfO_2$), a combination of these, or other suitable insulating dielectric layers.

In an embodiment, an opening is made in the first dielectric layer 124, and a gate electrode 140 is formed over the semiconductor substrate 114 in the active region 130. The gate electrode 140 is electrically coupled to the channel 109 through the cap layer 112 and barrier layer 110. Changes to the electric potential on the gate electrode 140 shifts the quasi Fermi level for the barrier layer 110 compared to the quasi Fermi level for the channel layer 108 and thereby modulates the electron concentration in the channel 109 within the semiconductor substrate 114 under the gate electrode 140. The gate electrode 140 may be configured as a Schottky gate, for example, and may be formed over and directly in contact with the cap layer 112 of the semiconductor substrate 114 using a Schottky material layer and a conductive metal layer. A conductive low stress metal may be deposited over the Schottky material layer to form gate electrode 140, in an embodiment. The gate electrode 140 may be T-shaped with a vertical stem, as shown, or may be a square shape in other embodiments. In other embodiments, the gate electrode 140 may be recessed through the cap layer 112 and extend partially into the barrier layer 110, increasing the electrical coupling of the gate electrode 140 to the channel 109 through the barrier layer 110. In other embodiments, the gate electrode 140 may be formed over a gate dielectric or gate oxide forming a metal-insulator-semiconductor (MIS) junction or metal oxide semiconductor (MOS) junction, electrically coupling to the channel 109 through the dielectric or oxide layer.

In an embodiment, a first current carrying contact 150 (e.g., a source or a drain contact) may be formed over and in contact with the semiconductor substrate 114 adjacent the gate electrode 140 in the active region 130. In an embodiment, the first current carrying contact 150 may form an ohmic electrode with an ohmic junction to the channel 109. The first current carrying contact 150 may be formed over and in contact with the cap layer 112. In other embodiments, the first current carrying contact 150 may be recessed through the cap layer 112 and may extend partially through the barrier layer 110. In still other embodiments, ion implantation may be used to form ohmic contact to the channel 109.

In an embodiment, a second current carrying contact 160 (e.g., a drain or a source contact) may be formed over and in contact with the semiconductor substrate 114 adjacent the gate electrode 140 in the active region 130. The second current carrying contact 160 may form a Schottky junction with the channel 109, thus acting as a Schottky diode incorporated into the second current carrying contact 160. In an embodiment, the second current carrying contact 160 may be formed over and in contact with the cap layer 112. In other embodiments, the second current carrying contact 160 may be recessed through the cap layer 112 and extend partially through the barrier layer 110 to form a Schottky junction.

In an embodiment, metal electrodes (not shown) may be formed on or over the first and second current carrying contacts 150, 160 in the active region 130. In addition, one or more additional dielectric layers (not shown) may be formed over the metal electrodes, the gate electrode 140, the first and second current carrying contact 150, 160, and the first dielectric layer 124 in the isolation regions 120 and the active region 130. The additional dielectric layer(s) encapsulate the active region 130 and the isolation regions 120, protecting the surface from moisture and other contaminants. Additional metal electrodes, dielectric layers, and patterned metal layers also may be formed to provide desired electrical connectivity to the transistor device within the active region 130.

In the device of FIG. 1, the enhanced resistivity region of the implanted region 180 may address the issue of the undesirable tradeoff between leakage current and drain lag in a conventional type III-N device (e.g., a gallium nitride (GaN) device) by making at least the buffer and/or nucleation layers more electrically resistive or inert, when compared with their resistivity prior to the ion implantation process. This may result in a reduction in leakage current through the buffer and/or nucleation layers. In FIG. 1, a leakage path that may be present in a conventional device (i.e., a device that does not include an implanted region 180) is indicated by arrow 190. With the increased resistivity of the buffer layer 106 provided by an implanted region 180 in accordance of the various embodiments, substantially less leakage current may travel through the buffer layer 106, thus improving performance of device 100 in comparison to conventional devices.

Figure 2:
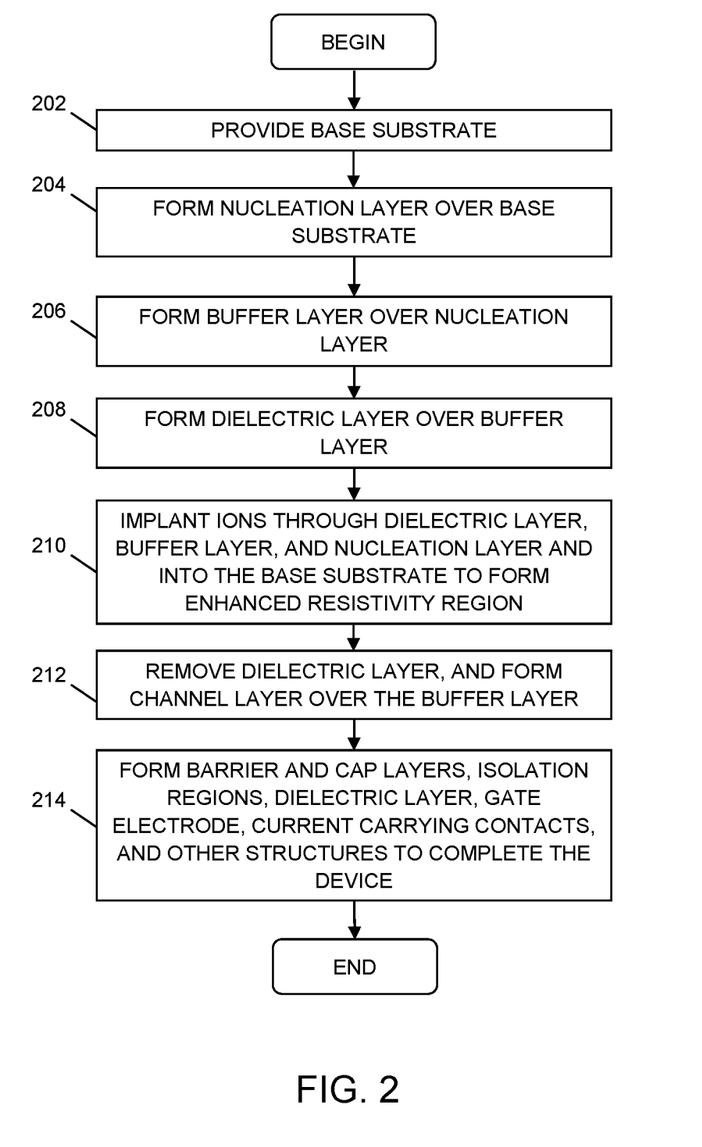
FIG. 2 is a flowchart of a method for fabricating a semiconductor device with an enhanced resistivity region, in accordance with an example embodiment.

Embodiments of methods for fabricating a semiconductor device (e.g., device 100) that includes an enhanced resistivity region (e.g., region 180) will now be described. More specifically, FIG. 2 is a flowchart of a method for fabricating a semiconductor device with an enhanced resistivity region, in accordance with an example embodiment. FIG. 2 should be viewed in conjunction with FIGS. 3-6, which illustrate cross-sectional, side views of a series of fabrication steps for producing the semiconductor device of FIG. 1, in accordance with an example embodiment.

Figure 3:
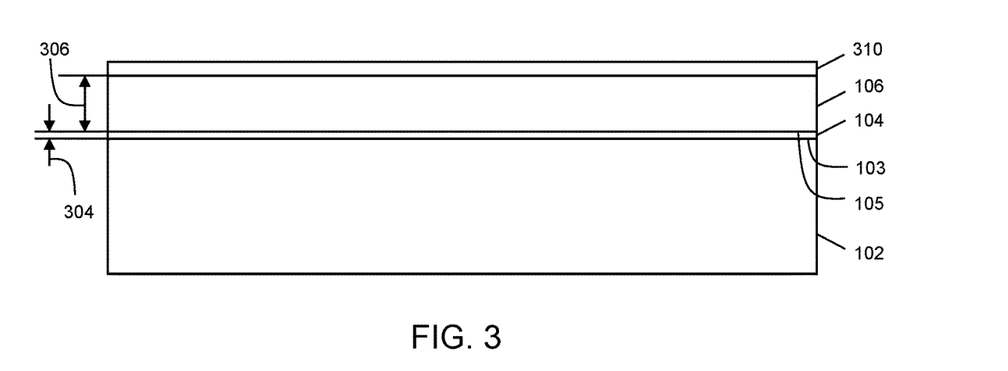
FIGS. 3-6 illustrate cross-sectional, side views of a series of fabrication steps for producing the semiconductor device of FIG. 1, in accordance with an example embodiment.

Referring both to FIG. 2 and FIG. 3, the method may begin, in block 202, by providing a base substrate 102. As discussed previously, the base substrate 102 may include SiC, or may include other materials such as sapphire, Si, GaN, AlN, diamond, poly-SiC, silicon on insulator, GaAs, InP, or other substantially insulating or high resistivity materials.

In block 204, a nucleation layer 104 is formed on or over the upper surface 103 of the base substrate 102. As discussed previously, an embodiment of the nucleation layer 104 includes a heteroepitaxial layer formed from a material selected from AlN, GaN, AlGaN, InAlN, InGaN, or other suitable materials. The nucleation layer 104 starts at the upper surface 103 of the base substrate 102 and has a thickness 304 in a range of about 100 angstroms to about 2000 angstroms. The nucleation layer 104 may be grown on or over the upper surface 103 of base substrate 102 using one of metal-organo chemical vapor deposition (MOCVD), molecular beam epitaxy (MBE), hydride-vapor phase epitaxy (HVPE) or a combination of these techniques, although other suitable techniques alternatively may be used.

In block 206, a buffer layer 106 (also referred to as a "first semiconductor layer") is formed on or over the upper surface 105 of the nucleation layer 104. As discussed previously, and according to an embodiment, the buffer layer 106 may include one or more group III-N semiconductor layers, including an epitaxially grown group III-nitride epitaxial layer (e.g., nitrogen (N)-face or gallium (Ga)-face materials), or alternatively may include Si, GaAs, InP, or other suitable materials. The buffer layer 106 may include at least one AlGaN mixed crystal layer.

In an embodiment, the buffer layer 106 is grown epitaxially on the upper surface 105 of the nucleation layer 104. The total thickness 306 of the buffer layer 106 may be between about 200 angstroms and about 20,000 angstroms, although other thicknesses may be used. The buffer layer 106 may be grown on or over the upper surface 105 of the nucleation layer 104 using one of MOCVD, MBE, HVPE or a combination of these techniques, although other suitable techniques alternatively may be used. According to an embodiment, the thickness 306 of the buffer layer 106 does not exceed a thickness through which an ion species may be implanted through the entire depth of the buffer layer 106 to form an implanted region 180 that includes an enhanced resistivity region (FIGS. 1, 4).

In block 208, a sacrificial dielectric layer 310 optionally is formed on or over the upper surface of the buffer layer 106. The sacrificial dielectric layer 310 may function to protect the surface of the buffer layer 106 from exposure to contaminants that may be present in the atmosphere during subsequent processing steps (e.g., before and during the ion implantation process of block 210).

The sacrificial dielectric layer 310 may include one of $Si_3N_4$, $SiO_2$, SiON, $Al_2O_3$, $HfO_2$, polycrystaline AlN, a combination of these, or other suitable dielectric layers. The total thickness of the layers used to form sacrificial dielectric layer 310 may be between about 30 and about 10,000 angstroms in thickness, although other thickness values may be used. The sacrificial dielectric layer 310 may be deposited using low pressure chemical vapor deposition (LPCVD), plasma-enhanced chemical vapor deposition (PECVD), sputtering, physical vapor deposition (PVD), atomic layer deposition (ALD), catalytic chemical vapor deposition (Cat-CVD), hot-wire chemical vapor deposition (HWCVD), electron-cyclotron resonance (ECR) CVD, inductively coupled plasma (ICP) CVD, a combination of these or other suitable dielectric deposition technique(s). In other embodiments, the sacrificial dielectric layer 310 may be grown in-situ in conjunction with the growth of buffer layer 106 using MOCVD or MBE, as described previously. In an alternate embodiment, deposition of the sacrificial dielectric layer 310 may be excluded from the process.

Figure 4:
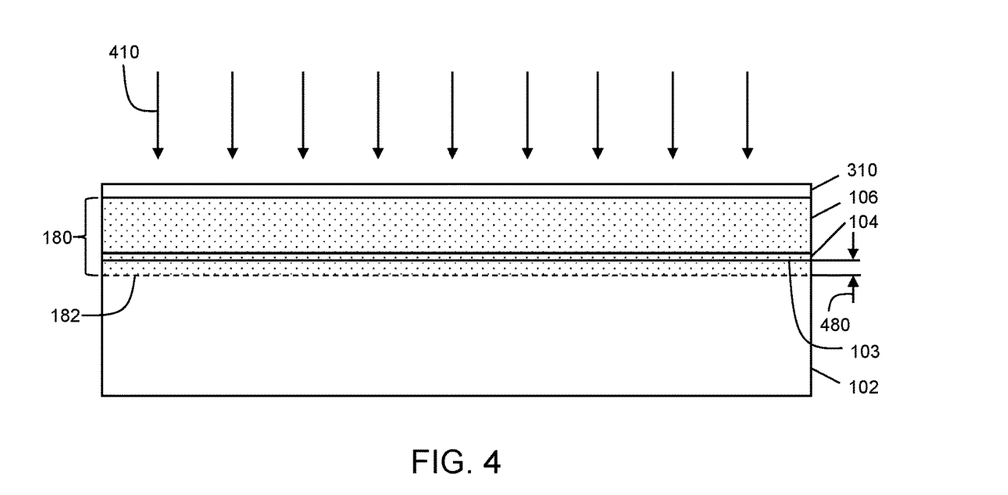

Referring both to FIG. 2 and FIG. 4, the method may continue, in block 210, by implanting ions (indicated by arrows 410) of a suitable species (i.e., a species that enhances the resistivity of buffer layer 106 by disrupting the crystal lattice and/or introducing compensating dopants as a result of the implantation process) through the dielectric layer 310 (if included), the buffer layer 106, and the nucleation layer 104, and into the base substrate 102 to form an implanted region 180 that includes an enhanced resistivity region, in an embodiment. As discussed previously, in various embodiments, the one or more ion species within the implanted region 180 are selected from boron, arsenic, helium, beryllium, magnesium, argon, aluminum, phosphorus, nitrogen, oxygen, carbon, and iron. Other suitable ion species may be used, as well. Further, the dopant concentration of the one or more ion species within the implanted region 180 may be between about $10^{15}$ cm$^{-3}$ and about $10^{19}$ cm$^{-3}$ or, in some embodiments, between about $5 \times 10^{15}$ cm$^{-3}$ and about $1 \times 10^{18}$ cm$^{-3}$ though other higher or lower concentrations may be used.

The implant energy and acceleration voltage used to implant the ions are sufficient to ensure substantial penetration of the ions through the various layers to a desired depth. For example, the acceleration voltage used to implant the ions may be in a range of about 50 kilovolts to about 200 kilovolts, although lower or higher acceleration voltages alternatively may be used.

According to an embodiment, the implanted region 180 has a lower boundary 182 that is located a distance 480 below the upper surface 103 of the base substrate 102, in an embodiment. For example, the lower boundary 182 of the implanted region 180 may be in a range of 50 angstroms to about 20,000 angstroms below the upper surface 103 of the base substrate 102, although the lower boundary 182 may be located at a shallower or deeper distance below the upper surface 103 of the base substrate 102, as well. In still other embodiments (not illustrated), the lower boundary 182 may substantially coincide with the upper surface 103 of the base substrate 102, or the lower boundary 182 may be above the upper surface 103 of the base substrate 102 (e.g., the lower boundary 182 may be in the nucleation layer 104 or the buffer layer 106).

Figure 5:
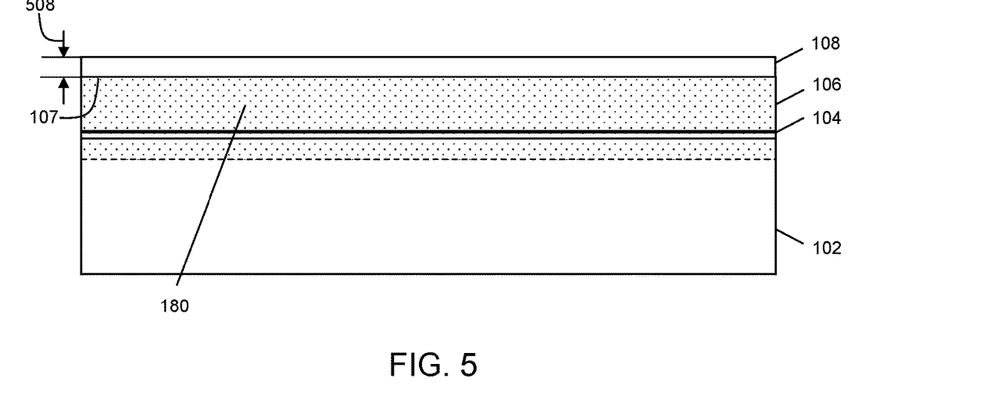

Referring both to FIG. 2 and FIG. 5, the dielectric layer 310 (if included) is removed, in block 212, and a channel layer 108 is formed on or over the upper surface 107 of the buffer layer 106 and the implanted region 180. As discussed previously, the channel layer 108 may include one or more group III-N semiconductor layers (e.g., including high quality NID GaN). The channel layer 108 may be grown on or over the upper surface 107 of the buffer layer 106 using one of MOCVD, MBE, HVPE or a combination of these techniques, although other suitable techniques alternatively may be used. The thickness 508 of the channel layer 108 may be between about 100 angstroms and about 10.0 microns, or between about 1000 angstroms to about 5000 angstroms, or between about 1000 angstroms to about 1.0 microns, although other thicknesses alternatively may be used.

In the above-described embodiment, the implantation process used to create the implanted region 180 with the enhanced resistivity region is performed before formation of the channel layer 108. In an alternate embodiment, both the buffer and channel layers 106, 108 may be formed, and the implantation process may be performed thereafter. In such an embodiment, the implantation procedure would be performed to bury the implanted region 180 below the upper surface of the channel layer 108.

Figure 6:
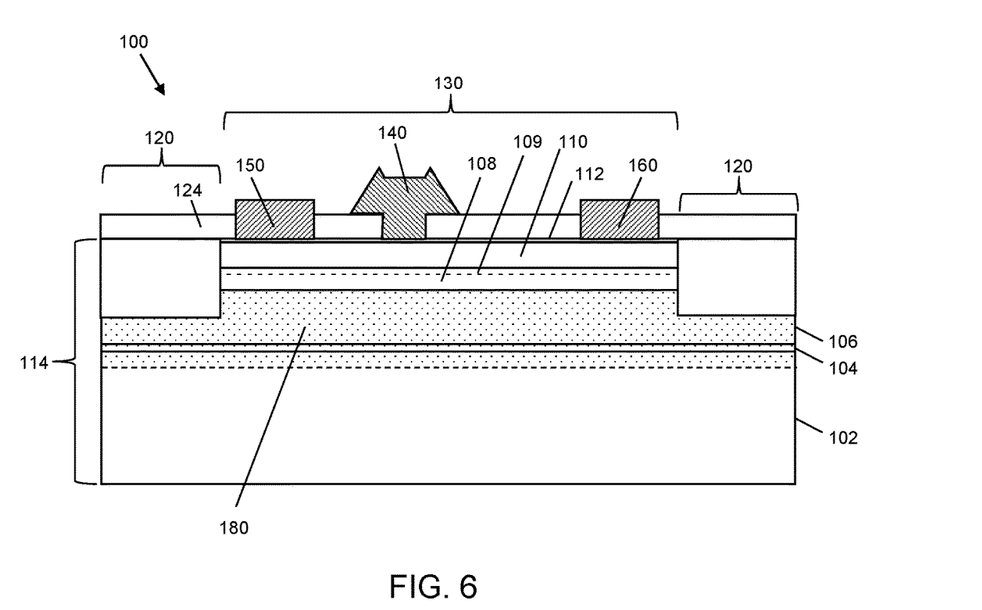

Referring both to FIG. 2, and FIG. 6, additional semiconductor layers and structures are formed, in block 214, to complete the semiconductor device 100. For example, and as indicated previously, this may include forming a barrier layer 110 on or over the channel layer 108 (resulting in the creation of a channel 109 in the form of a 2-DEG), and forming a cap layer 112 on or over the barrier layer 110. Conventional semiconductor processing techniques may be used to form the barrier and cap layers 110, 112, and such techniques are not described in detail herein for the purpose of brevity.

Additional processes for completing the semiconductor device 100 may include forming one or more isolation regions 120 to define an active region 130 along upper surface of the semiconductor substrate 114, forming a first dielectric layer 124 over at least the active region 130, forming a gate electrode 140, and forming first and second current carrying contacts 150, 160 (e.g., source and drain contacts). Additional metal electrodes, dielectric layers, and patterned metal layers (not illustrated) also may be formed to provide desired electrical connectivity to the transistor device within the active region 130. Once again, conventional semiconductor processing techniques may be used to form the isolation regions 120, the first dielectric layer 124, the gate electrode 140, the current carrying contacts 150, 160, and the additional structures, and such techniques are not described in detail herein for the purpose of brevity.

Embodiments of a semiconductor device include a base substrate including an upper surface, a nucleation layer disposed over the upper surface of the base substrate, a first semiconductor layer disposed over the nucleation layer, a second semiconductor layer disposed over the first semiconductor layer, a channel within the second semiconductor layer and proximate to an upper surface of the second semiconductor layer, and an implanted region in which one or more ion species are implanted. The implanted region includes an enhanced resistivity region, and the implanted region has an upper boundary located a distance below the channel and the upper surface of the second semiconductor layer.

Other embodiments of a semiconductor device include a base substrate including an upper surface, a nucleation layer disposed over the base substrate, a first gallium nitride layer disposed over the nucleation layer, an enhanced resistivity region with an upper boundary proximate to an upper surface of the first gallium nitride layer, a second gallium nitride layer disposed over the first gallium nitride layer and the enhanced resistivity region, and a channel within a portion of the second gallium nitride layer overlying the enhanced resistivity region and proximate to an upper surface of the second gallium nitride layer.

Embodiments of a method of fabricating a semiconductor device include forming a nucleation layer over an upper surface of a base substrate, forming a first semiconductor layer over the nucleation layer, and implanting one or more ion species through the first semiconductor layer to form an enhanced resistivity region with an upper boundary proximate to an upper surface of the first semiconductor layer. The enhanced resistivity region comprises at least a portion of the first semiconductor layer. The method further includes forming a second semiconductor layer over the first semiconductor layer and the enhanced resistivity region, and forming a channel within a portion of the second semiconductor layer overlying the enhanced resistivity region and proximate to an upper surface of the second semiconductor layer.

Although the illustrated and above-described semiconductor device has a particular HEMT structure, those of skill in the art would understand, based on the description herein, that various modifications may be made to produce differently configured structures that include the inventive subject matter. For example, a HEMT device with an enhanced resistivity region below the channel may include more and/or different semiconductor layers and/or other electrically-active or electrically-inactive structures. In addition, although the above-described device embodiments pertain to a HEMT device with a channel in the form of a 2-DEG, an enhanced resistivity region may be incorporated into a HEMT device with a channel in the form of a two dimensional hole gas (2-DHG) near the interface between the channel and barrier layers, in other embodiments. In still other embodiments, an enhanced resistivity region may be incorporated into a device other than a HEMT device, including but not limited to metal semiconductor field effect transistors (MESFET's) and metal-oxide semiconductor field effect transistors (MOSFET's).

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the foregoing detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a base substrate including an upper surface;
a nucleation layer disposed over the upper surface of the base substrate;
a first semiconductor layer disposed over the nucleation layer;
a second semiconductor layer disposed over the first semiconductor layer;
a channel within the second semiconductor layer and proximate to an upper surface of the second semiconductor layer; and
an implanted region in which one or more ion species are implanted, wherein the implanted region includes an enhanced resistivity region with a disrupted crystal lattice, and the implanted region has an upper boundary located a distance below the channel and the upper surface of the second semiconductor layer, wherein the implanted region extends through the first semiconductor layer.

2. The semiconductor device of claim 1, wherein the implanted region also extends through the nucleation layer.

3. A semiconductor device comprising:
a base substrate including an upper surface;
a nucleation layer disposed over the upper surface of the base substrate;
a first semiconductor layer disposed over the nucleation layer;
a second semiconductor layer disposed over the first semiconductor layer;
a channel within the second semiconductor layer and proximate to an upper surface of the second semiconductor layer; and
an implanted region in which one or more ion species are implanted, wherein the implanted region includes an enhanced resistivity region, and the implanted region has an upper boundary located a distance below the channel and the upper surface of the second semiconductor layer, wherein the implanted region extends through the first semiconductor layer, wherein the implanted region also extends through the nucleation layer, and
wherein the implanted region also extends into a portion of the base substrate.

4. A semiconductor device comprising:
a base substrate including an upper surface;
a nucleation layer disposed over the upper surface of the base substrate;
a first semiconductor layer disposed over the nucleation layer;
a second semiconductor layer disposed over the first semiconductor layer;
a channel within the second semiconductor layer and proximate to an upper surface of the second semiconductor layer; and
an implanted region in which one or more ion species are implanted, wherein the implanted region includes an enhanced resistivity region with a disrupted crystal lattice, and the implanted region has an upper boundary located a distance below the channel and the upper surface of the second semiconductor layer, and wherein the enhanced resistivity region is present within the first semiconductor layer.

5. The semiconductor device of claim 4, wherein the enhanced resistivity region also extends into the nucleation layer.

6. The semiconductor device of claim 4, wherein the nucleation layer comprises a heteroepitaxial layer formed from a material selected from aluminum nitride, gallium nitride, aluminum gallium nitride, indium gallium nitride, and indium aluminum nitride.

7. The semiconductor device of claim 4, wherein the first and second semiconductor layers comprise not intentionally doped gallium nitride.

8. The semiconductor device of claim 4, wherein the one or more ion species are selected from boron, arsenic, helium, beryllium, magnesium, argon, aluminum, and phosphorus.

9. The semiconductor device of claim 4, wherein the one or more ion species are selected from nitrogen, oxygen, carbon, and iron.

10. The semiconductor device of claim 4, wherein the ion species have a concentration within the enhanced resistivity region between $5 \times 10^{15}$ cm$^{-3}$ and $1 \times 10^{18}$ cm$^{-3}$.

11. The semiconductor device of claim 4, further comprising:
a source contact and a drain contact formed over the second semiconductor layer and electrically coupled to the channel; and
a gate electrode disposed over the second semiconductor layer between the source contact and the drain contact and electrically coupled to the channel.

12. A semiconductor device comprising:
a base substrate including an upper surface;
a nucleation layer disposed over the base substrate;
a first gallium nitride layer disposed over the nucleation layer;
an enhanced resistivity region with a disrupted crystal lattice, with an upper boundary proximate to an upper surface of the first gallium nitride layer, wherein the enhanced resistivity region is present within the first gallium nitride layer;
a second gallium nitride layer disposed over the first gallium nitride layer and the enhanced resistivity region; and
a channel within a portion of the second gallium nitride layer overlying the enhanced resistivity region and proximate to an upper surface of the second gallium nitride layer.

13. The semiconductor device of claim 12, wherein the base substrate comprises a material selected from silicon carbide (SiC), sapphire, silicon, gallium nitride, aluminum nitride, diamond, poly-SiC, silicon on insulator, gallium arsenide, and indium phosphide.

14. The semiconductor device of claim 12, wherein the nucleation layer comprises a heteroepitaxial layer formed from a material selected from aluminum nitride, and aluminum gallium nitride.

15. The semiconductor device of claim 12, wherein the one or more ion species are selected from boron, arsenic, helium, beryllium, magnesium, argon, aluminum, phosphorus, nitrogen, oxygen, carbon, and iron.

16. The semiconductor device of claim 12, wherein the ion species have a concentration within the enhanced resistivity region between $5 \times 10^{15}$ cm$^{-3}$ and $1 \times 10^{18}$ cm$^{-3}$.

17. A method of fabricating a semiconductor device, the method comprising the steps of:
forming a nucleation layer over an upper surface of a base substrate;
forming a first semiconductor layer over the nucleation layer;
implanting one or more ion species through the first semiconductor layer to form an enhanced resistivity region with a disrupted crystal lattice with an upper boundary proximate to an upper surface of the first semiconductor layer, wherein the enhanced resistivity region is present within the first semiconductor layer;
forming a second semiconductor layer over the first semiconductor layer and the enhanced resistivity region; and
forming a channel within a portion of the second semiconductor layer overlying the enhanced resistivity region and proximate to an upper surface of the second semiconductor layer.

18. The method of claim 17, wherein the nucleation layer comprises a heteroepitaxial layer formed from a material selected from aluminum nitride, and aluminum gallium nitride.

19. The method of claim 17, wherein the first and second semiconductor layers comprise gallium nitride.

20. The method of claim 17, wherein the one or more ion species are selected from boron, arsenic, helium, beryllium, magnesium, argon, aluminum, phosphorus, nitrogen, oxygen, carbon, and iron.

21. The method of claim 17, wherein the ion species are implanted to a concentration within the enhanced resistivity region between $5 \times 10^{15}$ cm$^{-3}$ and $1 \times 10^{18}$ cm$^{-3}$.

22. The method of claim 17, wherein implanting the one or more ion species comprises implanting the one or more ion species at an acceleration voltage between 50 kilovolts and 200 kilovolts.

23. The method of claim 17, further comprising:
after the step of forming the first semiconductor layer and before the step of implanting the one or more ion species, forming a dielectric layer over the upper surface of the first semiconductor layer; and
after the step of implanting the one or more ion species, removing at least a portion of the dielectric layer.

24. The method of claim 17, further comprising:
forming a source contact and a drain contact over the second semiconductor layer and electrically coupled to the channel; and
forming a gate electrode over the second semiconductor layer between the source contact and the drain contact and electrically coupled to the channel.

* * * * *